United States Patent
Yamada

(10) Patent No.: US 7,733,616 B2
(45) Date of Patent: Jun. 8, 2010

(54) ABNORMALITY DETECTING DEVICE OF ELECTRIC POWER CONVERTING DEVICE AND ABNORMALITY DETECTING METHOD

(75) Inventor: Kenji Yamada, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 151 days.

(21) Appl. No.: 12/216,164

(22) Filed: Jun. 30, 2008

(65) Prior Publication Data
US 2009/0009920 A1    Jan. 8, 2009

(30) Foreign Application Priority Data
Jul. 4, 2007   (JP) ............... 2007-176068

(51) Int. Cl.
*H02H 7/08* (2006.01)

(52) U.S. Cl. .............. 361/31; 361/23; 361/1; 318/432; 318/434; 323/274; 323/273; 323/284; 363/50; 363/52; 363/53; 363/55; 363/56.01; 363/56.02; 363/56.03; 363/56.04

(58) Field of Classification Search .......... 361/31, 361/23, 1; 363/50, 52, 53, 55, 56.01, 56.02, 363/56.03, 56.04; 318/432, 434; 323/274, 323/273, 284
See application file for complete search history.

(56) References Cited
U.S. PATENT DOCUMENTS

| | | | | |
|---|---|---|---|---|
| 4,675,799 A | * | 6/1987 | Suzuki et al. ............ | 363/58 |
| 4,720,776 A | * | 1/1988 | Guyeska et al. .......... | 363/37 |
| 4,812,729 A | * | 3/1989 | Ito et al. ................. | 318/732 |
| 5,266,891 A | * | 11/1993 | Kumar et al. ............ | 324/765 |
| 6,057,728 A | * | 5/2000 | Igarashi .................. | 327/546 |
| 6,160,414 A | | 12/2000 | Matsubara et al. | |

FOREIGN PATENT DOCUMENTS

| | | |
|---|---|---|
| JP | A 64-64567 | 3/1989 |
| JP | A 6-205599 | 7/1994 |
| JP | A 7-71805 | 3/1995 |
| JP | A 8-308244 | 11/1996 |
| JP | A 10-23795 | 1/1998 |
| JP | A 11-122941 | 4/1999 |
| JP | A 2005-210830 | 8/2005 |
| JP | A 2005-278296 | 10/2005 |

\* cited by examiner

*Primary Examiner*—Rita Leykin
(74) *Attorney, Agent, or Firm*—Oliff & Berridge, PLC

(57) ABSTRACT

Each of three-phase arm of an inverter has first and second switching elements connected in series together at a connection point to the corresponding phase coil of the three-phase motor. Control device turns on the first switching element of the i-th (i is a natural number smaller than four) for a predetermined time period, and determines that the second switching element of the i-th arm has a short fault, when an overcurrent exceeding a predetermined threshold is detected within the predetermined time period. The predetermined time period is shorter than a time period from a time point of turning on the first switching element of the i-th arm to a time point of attaining the predetermined threshold by a current flowing through a path extending from a power supply line through the second switching element of the remaining arm other than the i-th arm to a ground line.

10 Claims, 10 Drawing Sheets

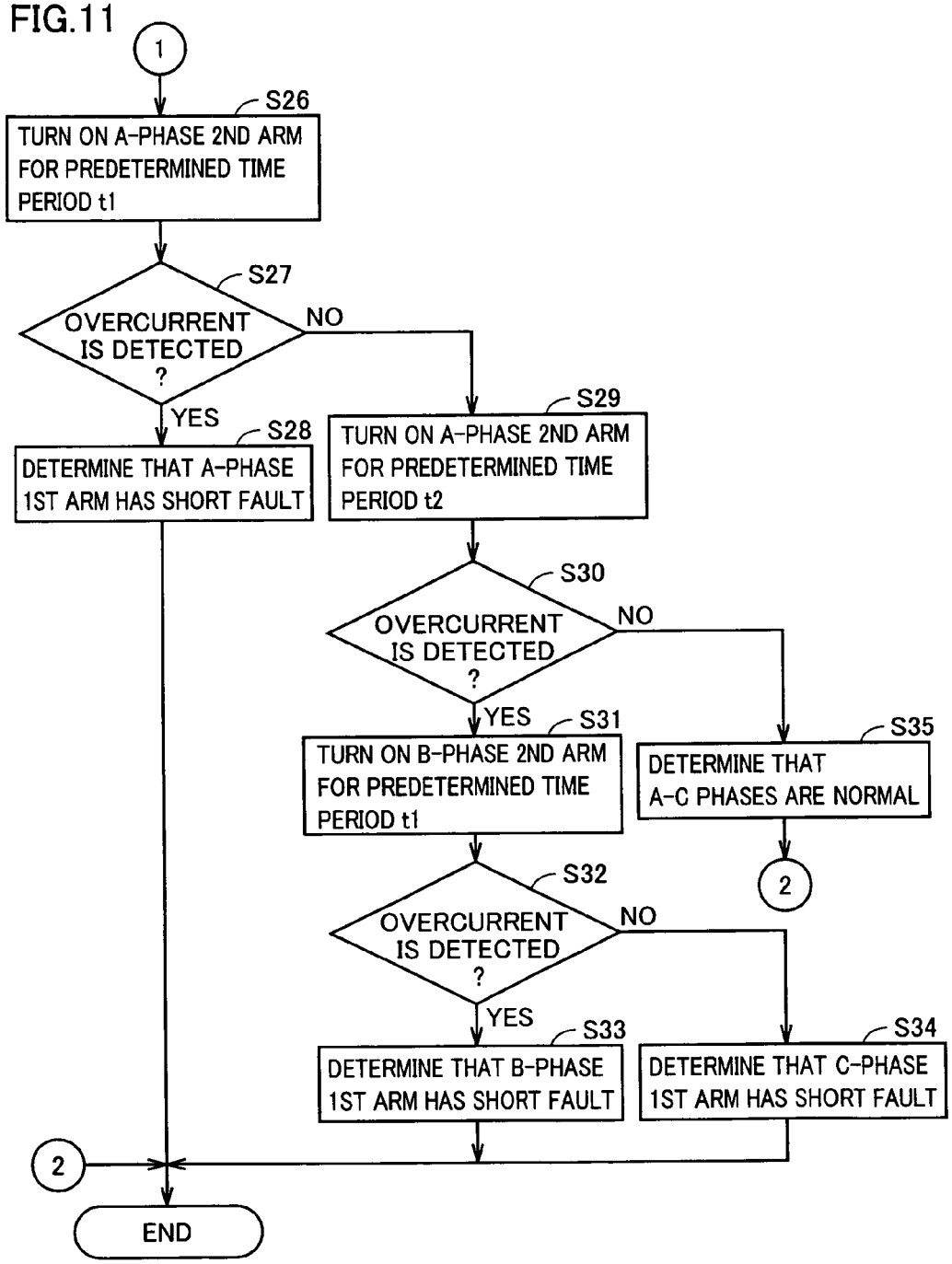

ABNORMALITY DETECTING DEVICE OF ELECTRIC POWER CONVERTING DEVICE AND ABNORMALITY DETECTING METHOD

This nonprovisional application is based on Japanese Patent Application No. 2007-176068 filed on Jul. 4, 2007 with the Japan Patent Office, the entire contents of which are hereby incorporated by reference.

BACKGROUND OF THE INVENTION

1. Field of the Invention

The present invention relates to an abnormality detecting device of an electric power converting device and an abnormality detecting method, and particularly to an abnormality detecting device for detecting a short circuit fault in a switching element forming an electric power converting device as well as an abnormality detecting method.

2. Description of the Background Art

In recent years, hybrid vehicles and electric vehicles have received attention as vehicles developed in view of environments. The hybrid vehicle uses, as a drive power source, a DC power supply, an inverter and an electric motor driven by the inverter in addition to a conventional engine. More specifically, the engine is driven to provide the drive power source, and further the inverter converts a DC voltage provided from the DC power supply into an AC voltage for driving the motor by the converted AC voltage to provide the drive power source.

The electric vehicle uses, as a drive power source, a DC power supply and an inverter as well as an electric motor driven by the inverter.

In the motor drive device mounted on the hybrid vehicle or the electric vehicle, when an abnormality such as a short fault in a switching element forming the inverter is detected, the inverter usually stops its operation to prevent overheating of the switching element due to passage of an excessive current through the short-circuited switching element.

For example, Japanese Patent Laying-Open No. 08-308244 has disclosed an abnormality determining method relating to an electric power converting device having a power converting unit in which three sets of switching arms each formed of two switching elements connected in series together are arranged in parallel between DC power supplies, and the switching operations of the switching elements convert the DC power into a three-phase AC power. In this electric power converting device, the above method successively turns on the six switching elements of the electric power converting unit according to a plurality of predetermined combination patterns, and determines the shorted faulty switching element based on changes appearing in an output or input current of the electric power converting unit.

In the above method, when the six switching elements are successively turned on, an output current detector detects a current only when two pairs of arms other than the arm including the faulty or defective switching element are in such a state that the switching elements of these arms located in the vertically opposite positions, respectively, are turned on. Based on this fact, a pattern required for determining any short fault in the switching elements as well as a logical table used for the determination are set or determined.

Japanese Patent Laying-Open No. 07-071805 has disclosed a control device of an air conditioner that includes arbitrary element turn-on means for turning on an arbitrary one of switching elements of an inverter unit, overcurrent detecting means for detecting an overcurrent flowing into the inverter unit, and self-diagnosis means for checking a short circuit of the switching elements by detecting the overcurrent flowing into the inverter unit.

According to this device, when an arbitrary element is turned on and a switching element connected in series to this arbitrary element is short-circuited, a short circuit current flows through a path extending from this arbitrary element to the switching element in question. An overcurrent detection circuit receives a detection value of a current detector connected between the switching element and a smoothing capacitor, and provides an overcurrent detection signal to a microcomputer. The microcomputer receives the overcurrent detection signal, and determines that the switching element in question has a short fault.

Further, Japanese Patent Laying-Open No. 2005-210830 has disclosed an abnormality detecting method for an inverter that includes a plurality of interconnections supplying a drive voltage of multiple phases to a motor, a plurality of positive arm elements supplying a positive drive voltage to the plurality of interconnections, respectively, and a plurality of negative arm elements supplying a negative drive voltage to the plurality of interconnections, respectively. This method includes the steps of successively switching the plurality of negative arm elements, successively switching the plurality of positive arm elements after the above step, determining a conduction state of the plurality of interconnections or a bus line by an arithmetic processing device based on a current signal or a bus current signal in response to every switching of one of the plurality of the negative and positive arm elements, and providing a first error signal by determining a "short fault" of one of the plurality of elements by the arithmetic processing device when a current flows through any one of the plurality of interconnections or the bus line.

Each of the abnormality detecting methods disclosed in the foregoing Japanese Patent Laying-Open Nos. 08-308244, 07-071805 and 2005-210830 determines the shorted faulty switching element based on changes that appear in current flowing through the inverter when the arbitrary switching element is turned on.

In this configuration, however, the overcurrent is detected when the arbitrary switching element (e.g., an upper arm of a U-phase arm) is turned on in either of the case in which the switching element (a lower arm of the U-phase arm) connected in series to the above switching element is shorted and the case in which short circuit occurs in a switching element (e.g., a lower arm of V- or W-phase) that belongs to the arm other than the U-phase arm and is vertically opposite to the above turned-on switching element. Therefore, it is impossible to accurately determine the shorted faulty switching element from a result of the detection of the overcurrent.

SUMMARY OF THE INVENTION

An object of the invention is to provide an abnormality detecting device of an electric power converting device that can accurately determine a shorted faulty switching element.

Another object of the invention is to provide an abnormality detecting method of an electric power converting device that can accurately determine a shorted faulty switching element.

According to the invention, an abnormality detecting device is a device for detecting an abnormality in an electric power converting device supplying a drive current to an AC motor. The electric power converting device includes first and second power supply lines supplying a DC power from a power supply, and first to n-th (n is a natural number) switching circuits connected in parallel between the first and second power supply lines, and connected to coils of first to n-th phases of the AC motor, respectively. Each of the first to n-th switching circuits has first and second switching elements connected in series together at a connection point which is connected to a coil of a corresponding phase of the AC motor. The abnormality detecting device includes a first switching control unit turning on the first switching element of the i-th (i is a natural number not exceeding n) switching circuit for a first predetermined time period, and a short fault determining unit determining that the second switching element of the i-th switching circuit has a short fault, when an overcurrent exceeding a predetermined threshold is detected within the first predetermined time period. The first predetermined time period is shorter than a time period, in the case where the short fault is present in any one of the second switching elements of the remaining switching circuits other than the i-th switching circuit, from a time point of turning on the first switching element of the i-th switching circuit to a time point of attaining the predetermined threshold by a current flowing through a short circuit path extending from the first power supply line through the AC motor and the second switching element of the remaining switching circuit to the second power supply line.

Further, according to the invention, an abnormality detecting method a method for detecting an abnormality in a power converting device supplying a drive current to an AC motor. The electric power converting device includes first and second power supply lines supplying a DC power from a power supply, and first to n-th (n is a natural number) switching circuits connected in parallel between the first and second power supply lines, and connected to coils of first to n-th phases of the AC motor, respectively. Each of the first to n-th switching circuits has first and second switching elements connected in series together at a connection point which is connected to a coil of a corresponding phase of the AC motor. The abnormality detecting method includes the steps of performing switching control to turn on the first switching element of the i-th (i is a natural number not exceeding n) switching circuit for a first predetermined time period, and determining that the second switching element of the i-th switching circuit has a short fault, when an overcurrent exceeding a predetermined threshold is detected within the first predetermined time period. The first predetermined time period is shorter than a time period, in the case where the short fault is present in any one of the second switching elements of the remaining switching circuits other than the i-th switching circuit, from a time point of turning on the first switching element of the i-th switching circuit to a time point of attaining the predetermined threshold by a current flowing through a short circuit path extending from the first power supply line through the AC motor and the second switching element of the remaining switching circuit to the second power supply line.

According to the abnormality detecting device and method described above, the time period for which the first switching element of the i-th switching circuit is on is restricted to the first predetermined time period so that the overcurrent is not detected when the faulty element is any one of the second switching elements of the remaining switching circuits. Thereby, the determination whether the second switching element of the i-th switching circuit has a short fault or not can be performed independently of the determination about the short fault in the second switching element of the remaining switching circuit. Consequently, the short-circuited faulty switching element can be accurately determined.

Preferably, the abnormality detecting device further includes a second switching control unit turning on the first switching element of the i-th switching circuit for a second predetermined time period longer than the first predetermined time period. The short fault determining unit determines that the second switching element of the remaining switching circuit has the short fault, when the overcurrent is not detected within the first predetermined time period and is detected within the second predetermined time period.

Preferably, the abnormality detecting method further includes the step of performing switching control to turn on the first switching element of the i-th switching circuit for a second predetermined time period longer than the first predetermined time period. The step of determining that the second switching element of the i-th switching circuit has the short fault includes the step of determining that the second switching element of the remaining switching circuit has the short fault, when the overcurrent is not detected within the first predetermined time period and is detected within the second predetermined time period.

According to the abnormality detecting device and method described above, the time period for which the first switching element of the i-th switching circuit is on is further expanded to the second predetermined time period so that it is possible to determine whether the second switching element of the remaining switching element has a short fault or not. Consequently, the number of required times of turning on the switching element for determining the short fault decreases so that damage to the switching element can be suppressed.

Preferably, the abnormality detecting device further includes a current sensor detecting the drive current supplied to each of the first to n-th coils. The short fault determining unit determines that the second switching element of the k-th (k is a natural number not exceeding n and is different from i) switching circuit has the short fault, when the overcurrent is not detected within the first predetermined time period and the current sensor detects the drive current supplied to the k-th coil.

Preferably, the electric power converting device further includes a current sensor detecting the drive current supplied to each of the first to n-th coils. The step of determining that the second switching element of the i-th switching circuit has the short fault in the abnormality detecting method includes the step of determining that the second switching element of the k-th (k is a natural number not exceeding n and is different from i) switching circuit has the short fault, when the overcurrent is not detected within the first predetermined time period and the current sensor detects the drive current supplied to the k-th coil.

According to the abnormality detecting device and method described above, the determination about the short fault in the second switching element of the i-th switching circuit as well as the determination about the short fault in the second switching element of the remaining switching circuit can be accurately and simultaneously by determining the current flowing through the AC motor within the first predetermined time period. Consequently, the number of required times of turning on the switching element for determining the short fault decreases so that damage to the switching element can be suppressed.

Preferably, the abnormality detecting device further includes a second switching control unit turning on the first switching element of the i-th switching circuit for a second predetermined time period longer than the first predetermined time period when the overcurrent is not detected within the first predetermined time period, and a third switching control unit turning on the first switching element of the k-th (k is a natural number not exceeding n and is different from i) switching circuit for the first predetermined time period when the overcurrent is detected within the second predetermined time period. The short fault determining unit determines that the second switching element of the k-th switching circuit has the short fault, when the overcurrent is detected within the first predetermined time period during an operation of the third switching control unit.

Preferably, the abnormality detecting method further includes the steps of performing switching control to turn on the first switching element of the i-th switching circuit for a second predetermined time period longer than the first predetermined time period when the overcurrent is not detected within the first predetermined time period, and performing switching control to turn on the first switching element of the k-th (k is a natural number not exceeding n and is different from i) switching circuit for the first predetermined time period when the overcurrent is detected within the second predetermined time period. The step of determining that the second switching element of the i-th switching circuit has the short fault includes the step of determining that the second switching element of the k-th switching circuit has the short fault, when the overcurrent is detected within the first predetermined time period during execution of the step of performing switching control to turn on the first switching element of the k-th switching circuit.

According to the abnormality detecting device and method described above, the time period for which the first switching element of the i-th switching circuit is on is further expanded to the second predetermined time period so that it is possible to determine that one of the second switching elements of the remaining switching elements has a short fault. Further, the first switching element of the remaining arm is turned on for the first predetermined time period so that the shorted faulty switching element can be determined. Consequently, the number of required times of turning on the switching element for determining the short fault decreases so that damage to the switching element can be suppressed.

Preferably, the power supply includes a voltage converter configured to control variably the DC voltage supplied to the first and second power supply lines by a boosting operation. The abnormality detecting device further includes a voltage conversion control unit stopping the boosting operation during execution of abnormality detection.

Preferably, the power supply includes a voltage converter configured to control variably the DC voltage supplied to the first and second power supply lines by a boosting operation. The abnormality detecting method further includes the step of stopping the boosting operation during execution of abnormality detection.

According to the abnormality detecting device and method described above, since the input voltage of the electric power converting device is suppressed to attain the power supply voltage level, it is possible to prevent passing of an excessive short circuit current through the switching element. Consequently, damage to the switching element can be suppressed.

According to the invention, the short-circuited faulty switching element can be accurately determines among the plurality of switching elements forming the inverter.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a flowchart for illustrating an operation of detecting a short fault in the switching element forming the inverter according to the fourth embodiment of the invention.

DESCRIPTION OF THE PREFERRED EMBODIMENTS

Embodiments of the invention will now be described with reference to the drawings. In the following description, the same or corresponding portions bear the same reference numbers and the same names.

First Embodiment

Figure 1:
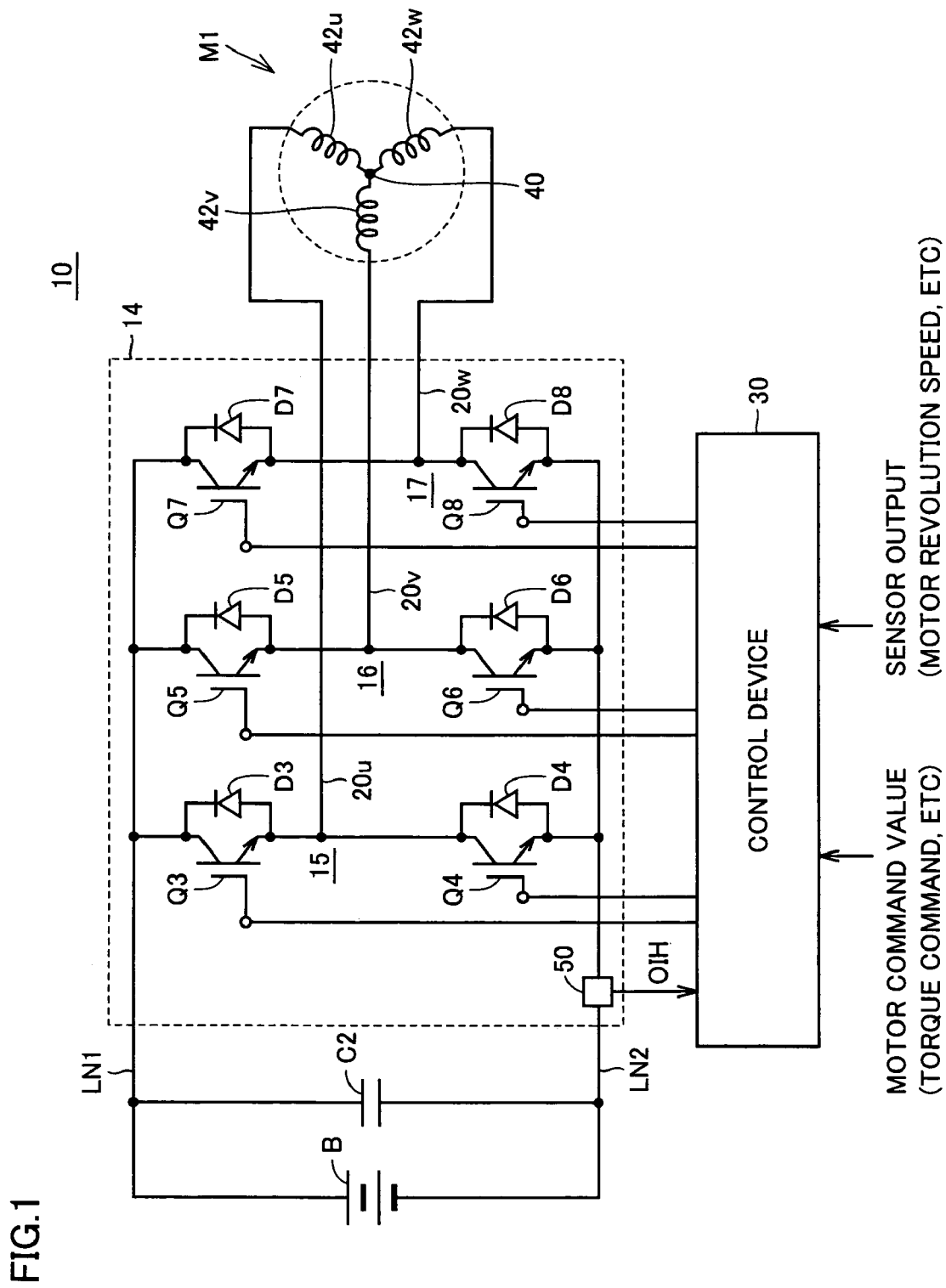
FIG. 1 is a circuit diagram showing a whole structure of a power supply system according to a first embodiment of the invention.

FIG. 1 is a circuit diagram showing a whole structure of a power supply system according to a first embodiment of the invention.

Referring to FIG. 1, a power supply system 10 includes a battery B that is a DC power supply, an inverter 14, a capacitor C2, a three-phase AC motor M1 and a control device 30.

Battery B has a positive electrode connected to a power supply line LN1 and a negative electrode connected to a ground line LN2. Battery B is a chargeable and dischargeable secondary battery, and is formed of, e.g., a nickel hydrogen battery or a lithium ion battery. Battery B may be replaced with a chargeable and dischargeable electricity accumulating device such as a capacitor other than the secondary battery.

Capacitor C2 is connected between power supply line LN1 and ground line LN2, and reduces an influence exerted on inverter 14 due to voltage variations.

Three-phase inverter 14 that is described as a typical example of the "electric power converting device" includes switching elements Q3-Q8, diodes D3-D8 and an overcurrent detecting device 50. Switching elements Q3-Q8 may be typically formed of power semiconductor elements such as IGBTs (Insulated Gate Bipolar Transistors) or MOSFETs, respectively. Switching elements Q3-Q8 are turned on/off based on gate control signals from control device 30. Diodes D3-D8 are arranged as antiparallel diodes of switching elements Q3-Q8.

Switching elements Q3-Q8 form U-, V- and W-phase arms corresponding to the "switching circuit". For example, switching elements Q3 and Q4 are connected in series between power supply line LN1 and ground line LN2, and thereby forms a U-phase arm 15. Likewise, switching elements Q5 and Q6 form a V-phase arm 16. Switching elements Q7 and V8 form a W-phase arm 17.

A concentration node between switching elements Q3 and Q4 is connected to an output conductor 20u, a concentration node between switching elements Q5 and Q6 is connected to an output conductor 20v and a connection node between switching elements Q7 and Q8 are connected to an output conductor 20w.

Three-phase AC motor M1 includes W-, V- and W-phase coils 42u, 42v and 42w. U-phase coil 42u is connected between a point between a neutral point 40 and output conductor 20u. Likewise, V-phase coil 42v is connected to a point between neutral point 40 and output conductor 20v, and W-phase coil 42w is connected to a point between neutral point 40 and output conductor 20w.

Overcurrent detecting device 50 is arranged on ground line LN2 for protecting inverter 14. Overcurrent detecting device 50 detects a current flowing through inverter 14, and detects the overcurrent when the detected value exceeds a predetermined threshold. In this case, overcurrent detecting device 50 produces an overcurrent detection signal OIH, and provides it to control device 30.

Control device 30 controls inverter 14 to drive three-phase AC motor M1 according to a motor command value such as a torque command, based on sensor outputs (a motor revolution speed, various voltages, various currents and/or the like). Thereby, inverter 14 supplies an AC voltage that can drive three-phase AC motor M1 according to the motor command value.

Control device 30 detects a short circuit or short fault in switching elements Q3-Q8 based on a switching pattern of switching elements Q3-Q8 and overcurrent detection signal OIH from overcurrent detecting device 50. Description will now be given on a method of detecting the short fault in switching elements Q3-Q8 forming inverter 14.

Figure 2:
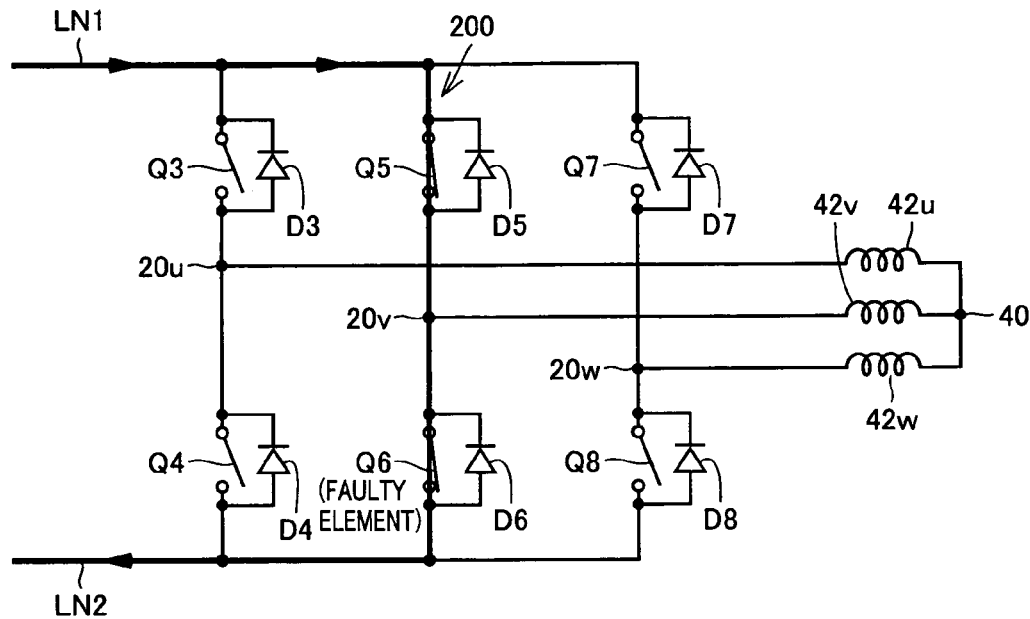
FIG. 2 is a circuit diagram illustrating an example of an inverter current in a switching pattern of an inverter.

FIG. 2 is a circuit diagram illustrating an example of the inverter current in a switching pattern of inverter 14. FIG. 2 shows, by way of example, a switching pattern in which switching element Q5 that is a V-phase upper arm element is turned on. Referring to FIG. 2, the following description is given on the manner in which the inverter current changes when the short circuit fault occurs in switching element Q6, i.e., the lower arm element of the same phase.

Referring to FIG. 2, when switching element Q5, that is the upper arm element of the same phase as the faulty element is turned on in an illustrated switching pattern, a short circuit path 200 is formed between power supply line LN1 and ground line LN2 through turned-on switching element Q5 and faulty switching element Q6. Thereby, a large short circuit current occurs to increase rapidly the inverter current.

Figure 3:
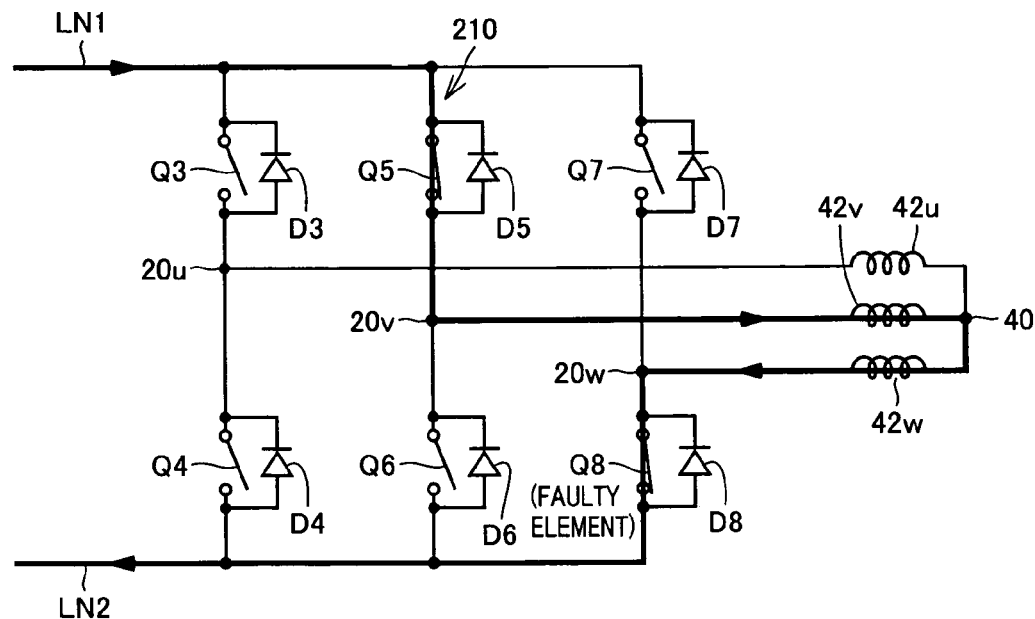
FIG. 3 is a circuit diagram illustrating another example of the inverter current in the switching pattern of the inverter.

Contrarily, when a switching pattern is the same as that in FIG. 2 but a short circuit fault occurs in a switching element that is a lower arm element of a phase different from that the turned-on switching element Q5, the inverter current changes as shown in FIG. 3.

FIG. 3 is a circuit diagram illustrating another example of the inverter current in the switching pattern of inverter 14.

Referring to FIG. 3, a short circuit fault occurs, e.g., in switching element Q8 that is a lower arm element of the W-phase. In this case, when switching element Q5 that is the upper arm element of the phase different from that of the faulty element is turned on, a short circuit path 210 is formed between power supply line LN1 and ground line LN2 through switching element Q5, output conductor 20v, V-phase coil 42v, neutral point 40, W-phase coil 42w, output conductor 20w and switching element Q8. In this case, a large short circuit current likewise occurs so that the inverter current increases.

When an arbitrary switching element, i.e., switching element Q5 is turned on as described above, the short circuit current occurs to increase the inverter current in either of the cases that switching element Q6 that is the lower arm element of the same phase has a fault, or that switching element Q8 (or Q7), i.e., the lower arm element of the different phase has a fault. Therefore, in the method of detecting the short fault in the switching element based on overcurrent detection signal OIH provided from overcurrent detecting device 50, overcurrent detection signal OIH is output in either of the above cases. This results in a problem that shorted faulty switching element cannot be accurately determined.

The following difference is present between short circuit paths 200 and 210 in FIGS. 2 and 3. Short circuit path 200 is represented by a series circuit formed of an inductance Ld and a resistance Rd of switching elements Q5 and Q6. However, short circuit path 210 is represented by a series circuit including an inductance Lm and a resistance Rm of three-phase AC motor M1 in addition to the above components Ld and Rd. When a DC voltage is applied to each circuit, the inverter current increases according to a time constant that depends on the corresponding inductance and resistance.

The time constant of short circuit path 200 in FIG. 2 is different from that of short circuit path 210 in FIG. 3. Usually, inductance Ld and resistance Rd of the switching element is much smaller than inductance Lm and resistance Rm of three-phase AC motor M1 so that short circuit path 210 in FIG. 3 has a larger time constant. Therefore, after the time when switching element Q5 is turned on, a difference occurs in change over time between the inverter currents that flow these paths, respectively. More specifically, the inverter current flowing through short circuit path 200 in FIG. 2 rises rapidly, and the inverter current flowing through short circuit path 210 in FIG. 3 rises slowly.

In this embodiment, therefore, the shorted faulty switching element is detected using a difference in change over time between the inverter currents. More specifically, when the switching pattern is configured to turn on only one switching element (e.g., Q5) of inverter 14, a time period t1 for turning on switching element Q5 is preset to be much shorter than a time period that elapses before the inverter current of short circuit path 210 in FIG. 3 attains a predetermined threshold causing an overcurrent. When the overcurrent is detected in inverter 14 within predetermined time period t1 thus set, it is determined that short circuit path 200 in FIG. 2 is formed, and it is determined that the short fault has occurred in switching element Q6 that is the lower arm element of the same phase as switching element Q5. When the overcurrent is not detected in inverter 14 within predetermined time period t1, switching element Q6 is normal and does not have the short fault.

The switching pattern of inverter 14 is set to turn on successively six switching elements Q3-Q8 of inverter 14 and to keep each switching element in the on state for predetermined time period t1, and the determination whether the overcurrent is detected within predetermined time period t1 or not is performed every time one of the switching elements is turned on. Thereby, any shorted faulty switching element can be detected.

Then, description will be given on a manner of setting predetermined time period t1 described above in the switching pattern of inverter 14.

First, description is given on changes over time in an inverter current i that flows through short circuit path 210 in FIG. 3 when a DC voltage V is applied to short circuit path 210 by turning on switching element Q5 at a time point of (t=0).

Assuming that short circuit path 210 in FIG. 3 is a series circuit of an inductance L and a resistance R, and DC voltage V is applied to this series circuit, the following equation is established:

$$V = L\,di/dt + Ri \quad (1)$$

By solving the differential equation (1) using (i(0)=0) where i(0) is the initial current at time t equal to 0 (t=0), the following equation is obtained:

$$i(t) = V/R\{1 - \exp(-Rt/L)\} \quad (2)$$

Then, time t when inverter current i attains a predetermined threshold Ith of the overcurrent can be obtained as follows, using the equation (2).

$$t = -L/R \cdot \log(1 - R \cdot Ith/V) \quad (3)$$

Since inductance L and resistance R can be substantially deemed as inductance Lm and resistance Rm of three-phase AC motor M1, respectively, a time period T that elapses before inverter current i reaches predetermined threshold Ith can be expressed by as follows:

$$T = -Lm/R \cdot \log(1 - Rm \cdot Ith/V) \quad (4)$$

Therefore, when the switching pattern of inverter 14 is configured to employ predetermined time period t1 shorter than this time period T and the faulty element is switching element Q8 (or Q4) that is the lower arm element different in phase from switching element Q5 in the on state, the inverter current is lower than predetermined threshold Ith so that overcurrent detecting device 50 does no detect the overcurrent. In other words, overcurrent detecting device 50 detects the overcurrent only when the faulty element is switching element Q6 that is the lower arm element of the same phase as switching element Q5. Consequently, the shorted faulty switching element can be accurately determined based on overcurrent detection signal OIH provided from overcurrent detecting device 50.

Figure 4:
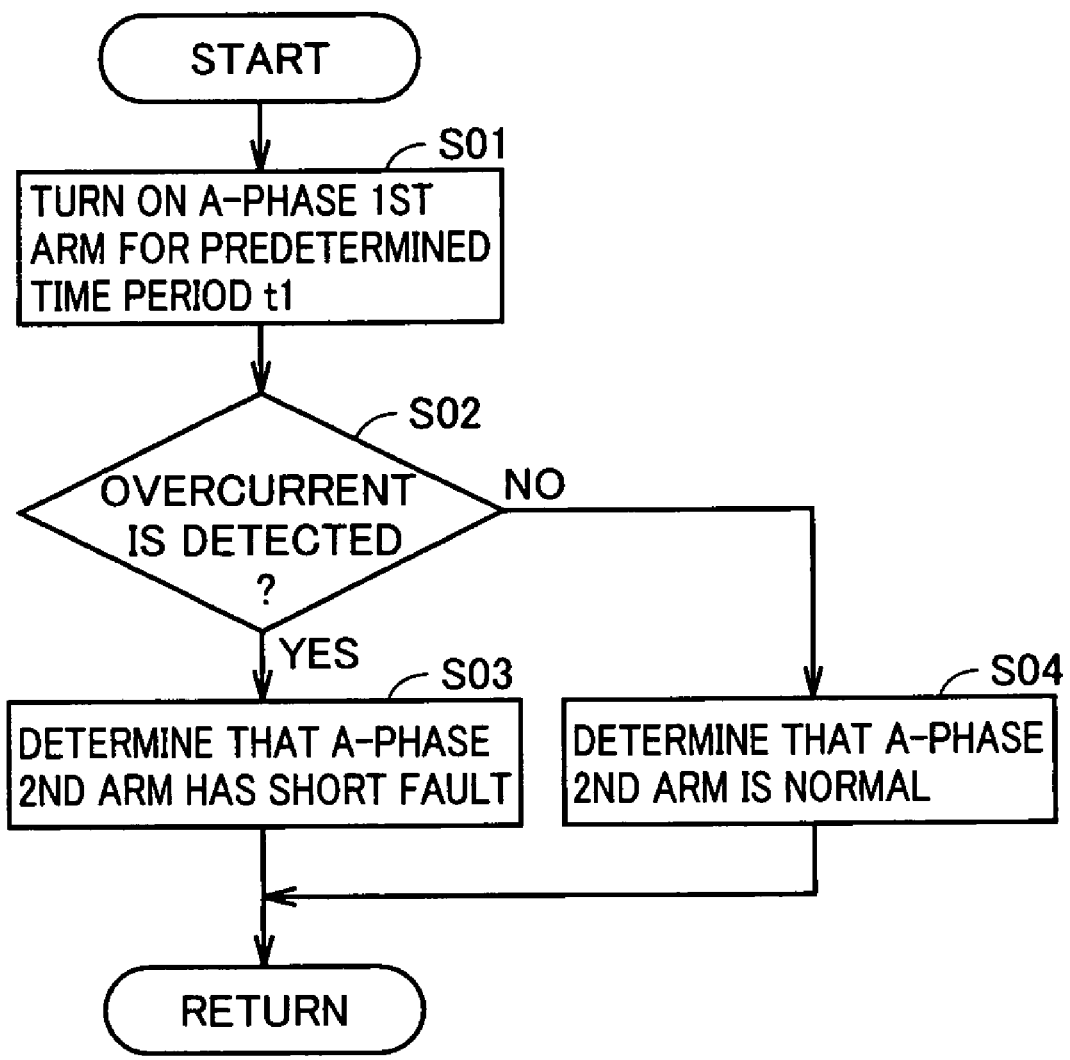
FIG. 4 is a flowchart for illustrating an operation of detecting a short fault in a switching element forming the inverter according to the first embodiment of the invention.

FIG. 4 is a flowchart for illustrating an operation of detecting the short fault in switching elements Q3-Q8 forming inverter 14 according to the first embodiment of the invention.

Referring to FIG. 4, when a series of operations start, control device 30 turns on the switching element forming a first arm of an A-phase for predetermined time period t1 (step S01). The A-phase is one of the U-, V- and W-phases, and the first arm is the upper arm or the lower arm.

Based on overcurrent detection signal OIH provided from overcurrent detecting device 50, control device 30 determines whether the overcurrent is detected in inverter 14 within predetermined time period t1 or not (step S02).

When an overcurrent is detected in inverter 14 within predetermined time period t1, control device 30 determines that the switching element forming a second arm of the A-phase has the short faulty (step S03). The second arm is vertically opposite to the first arm described above.

When the overcurrent is not detected in inverter 14 within predetermined time period t1 in step S02, control device 30 determines that the second arm of the A-phase is normal (i.e., has no fault) in step S04.

After steps S03 and S04, control device 30 returns to step S01, and changes one of A-phase and the first arms to that different from the phase or the arm in the last processing, respectively. For example, when the last processing was performed on switching element Q3 forming the U-phase upper arm, control device 30 changes the processing target to switching element Q4 forming the U-phase lower arm or switching element Q5 forming the V-phase upper arm. Then, control device 30 determines whether the overcurrent is detected or not, while the switching element thus changed is kept on for predetermined time period t1, and thereby performs the determination about the short fault in the switching element forming the arm that belongs to the same phase as the changed element but is vertically opposite to it. After the processing in steps S01-S04 is performed on all six switching elements Q3-Q8, control device 30 ends the series of operations.

In practice, a CPU (Central Processing Unit) executes the detection of the short fault in switching elements Q3-Q8 by control device 30. The CPU reads a program having these steps shown in FIG. 4 from a ROM (Read Only Memory), and executes the respective steps shown in FIG. 4 to determine the short fault in switching elements Q3-Q8.

Therefore, the ROM corresponding to a computer-readable (CPU-readable) recording medium bearing the programs for causing the computer (CPU) to execute the control for detecting the short fault in switching elements Q3-Q8.

In this embodiment, battery B, capacitor C2 and inverter 14 form a "power converting device" according to the invention. Overcurrent detecting device 50 and control device 30 form an "abnormality detecting device" according to the invention.

Second Embodiment

Figure 5:
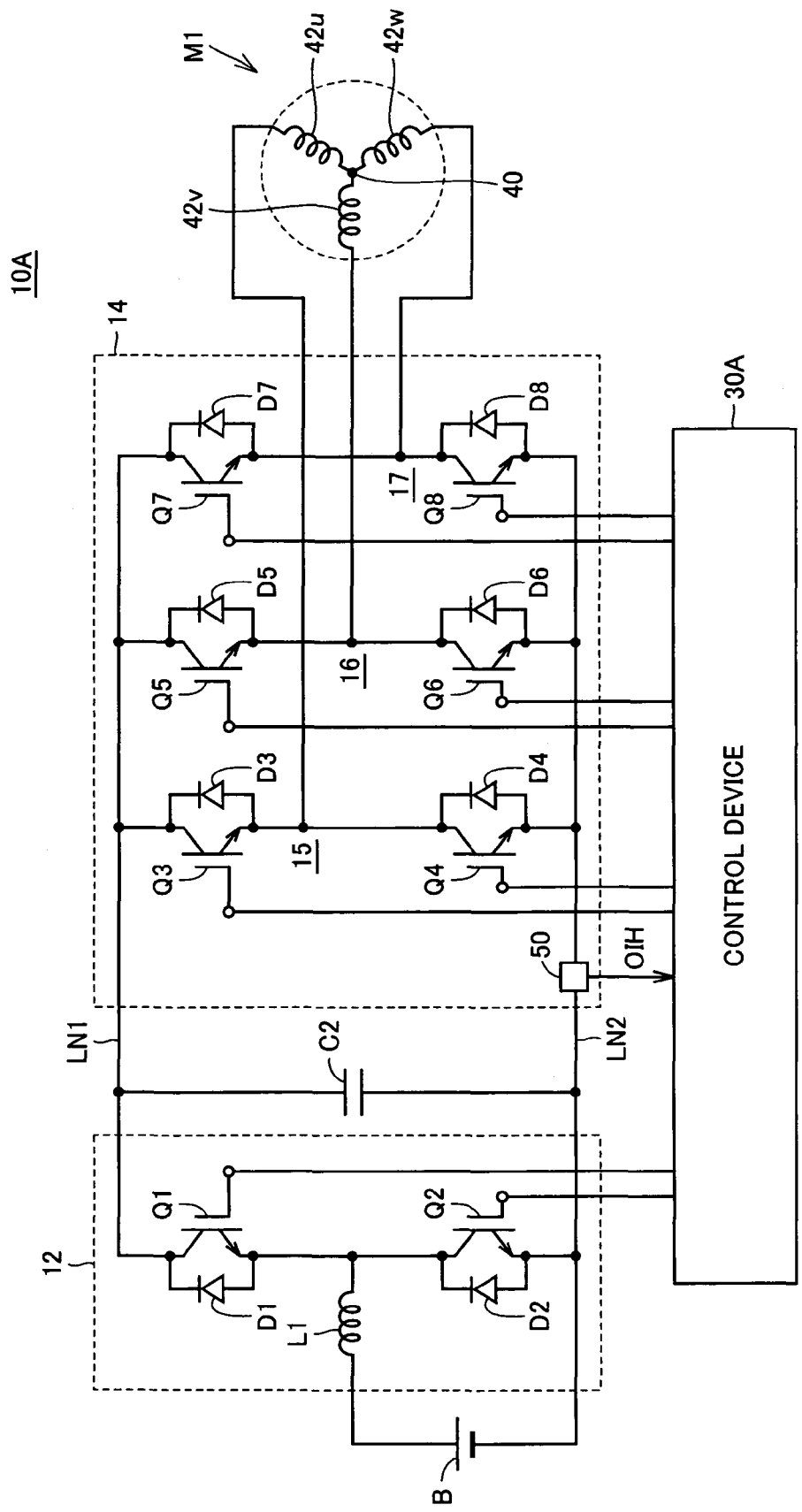
FIG. 5 is a circuit diagram showing a whole structure of a power supply system according to a second embodiment of the invention.

FIG. 5 is a circuit diagram showing a whole structure of a power supply system according to a second embodiment of the invention.

A power supply system 10A in FIG. 5 additionally includes a converter 12 that is a "voltage converter" between battery B and capacitor C2 in power supply system 10 in FIG. 1. Therefore, detailed description of the same portions as those in FIG. 1 will not be repeated.

Converter 12 boosts the DC voltage supplied from battery B, and supplies it to capacitor C2. Also, converter 12 steps down the DC voltage supplied from inverter 14 via capacitor C2, and supplies it to battery B.

More specifically, converter 12 is formed of, e.g., a step-up/down chopper circuit, and includes a reactor L1, switching elements Q1 and Q2, and diodes D1 and D2.

One end of reactor L1 is connected to the power supply line of battery B, and the other end thereof is connected to an intermediate point between switching elements Q1 and Q2, i.e., a point between an emitter of switching element Q1 and a collector of switching element Q2.

Switching elements Q1 and Q2 are connected in series between power supply line LN1 and ground line LN2. A collector of switching element Q1 is connected to power supply line LN1, and an emitter of switching element Q2 is connected to ground line LN2. Diode D1 and D2 are provided for switching elements Q1 and Q2, respectively, and each are connected between the collector and the emitter of the corresponding switching element Q1 or Q2 for passing a current from the emitter side to the collector side.

When converter 12 receives a control signal from a control device 30A, converter 12 boosts the DC voltage corresponding to a period for which the control signal keeps switching element Q2 in the on state, and supplies it to capacitor C2. Since converter 12 is used for boosting the battery voltage, the voltage of battery B can be reduced to about 200 V, and three-phase AC motor M1 can be driven with a high voltage exceeding 500 V. Thereby, an electric loss can be suppress because the electric power supply is performed with a small current, and further the high output of the motor can be achieved.

However, when the foregoing operation of detecting the short fault in switching elements Q3-Q8 is performed in the state where the battery voltage is boosted by converter 12, an excessive short circuit current flows through inverter 14 due to reception of the high voltage, and the switching elements other than the faulty element may be damaged.

Accordingly, the second embodiment is configured to perform an operation of detecting the short fault in switching elements Q3-Q8 after stopping the boosting operation of converter 12. This configuration can suppress and keep the input voltage of inverter 14 at the battery voltage level, and therefore can suppress damage of the switching element due to the operation for detecting the short fault.

Figure 6:
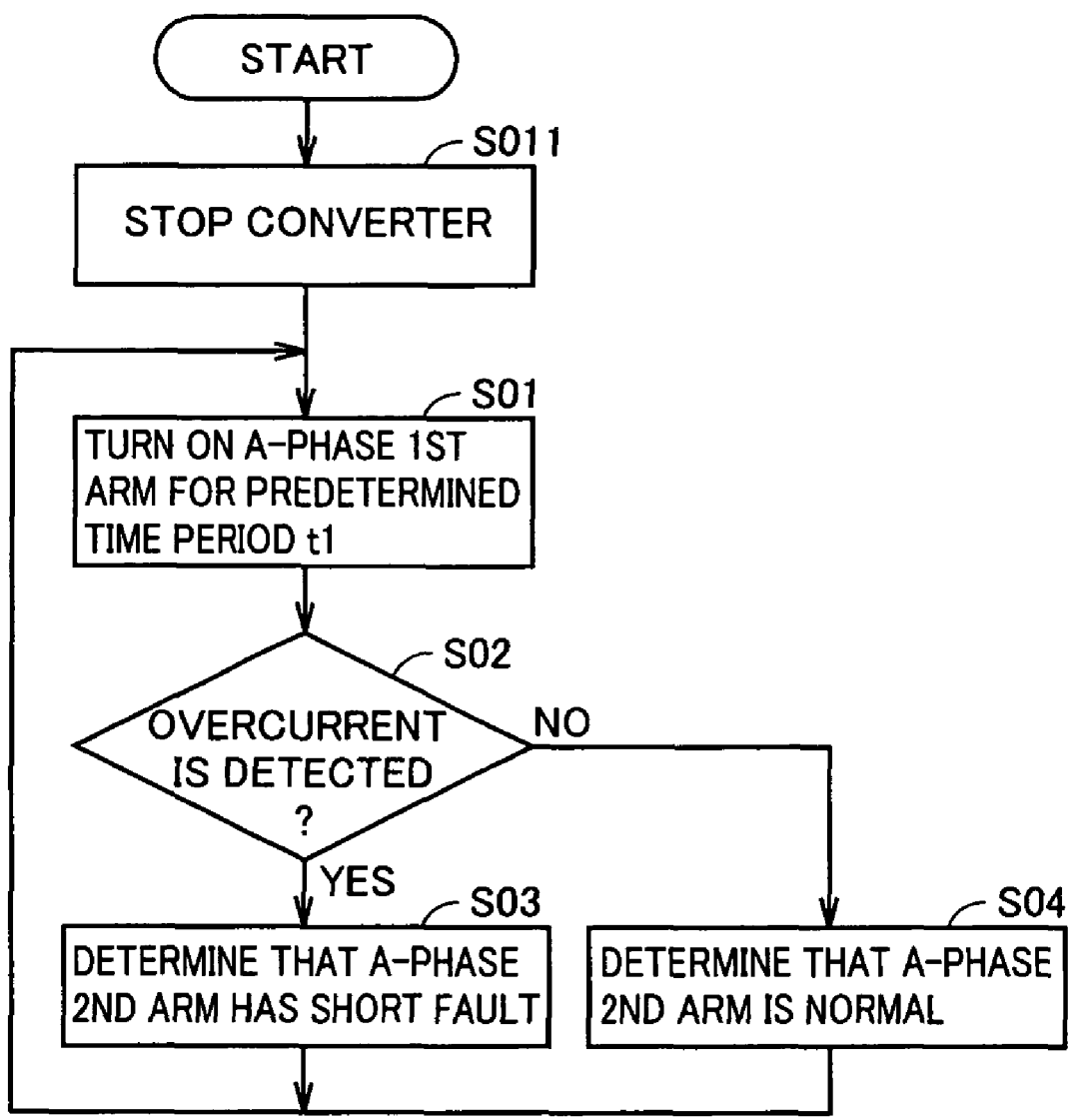
FIG. 6 is a flowchart for illustrating an operation of detecting a short fault in a switching element forming an inverter according to the second embodiment of the invention.

FIG. 6 is a flowchart for illustrating an operation of detecting the short fault in switching elements Q3-Q8 forming inverter 14 according to the second embodiment of the invention. The flowchart of FIG. 6 differs from that of FIG. 4 in that a step S011 is added before step S01 in the flowchart of FIG. 4. Therefore, steps S01-S04 overlapping with those in FIG. 4 will not be specifically described.

Referring to step S011 in FIG. 6, control device 30A stops the operation of converter 12 when a series of operations start. More specifically, control device 30A produces a control signal for turning off both switching elements Q1 and Q2 of converter 12, and provides it to converter 12. Thereby, the battery voltage of battery B is supplied to inverter 14 via reactor L1 and diode D1.

Control device 30A performs the processing in subsequent steps S01-S04 in the state where inverter 14 is being supplied with the battery voltage, and thereby detects any short fault in switching elements Q3-Q8.

Third Embodiment

In the first and second embodiments of the invention, the switching pattern is set to turn on successively switching elements Q3-Q8 forming inverter 14, and determines the shorted faulty switching element based on the relationship between overcurrent detection signal OIH and the switching pattern.

According to this configuration, the faulty element can be accurately determined by successively turning on all switching elements Q3-Q8. However, the number of times of turning on the switching elements increases in proportion to the number of the elements. Therefore, the switching elements may be significantly damaged due to an excessively large short circuit current that flows every time the switching element is turned on. In particular, when the short circuit path is formed via the switching elements forming the upper and lower arms of the same phase (see FIG. 2), the short circuit current rapidly increases to promote the damage of the faulty element.

Accordingly, the third and fourth embodiments will be described in connection with methods that can accurately determine the faulty element while suppressing damage of the switching element by reducing the number of times of turning on the switching elements as far as possible.

Figure 7:
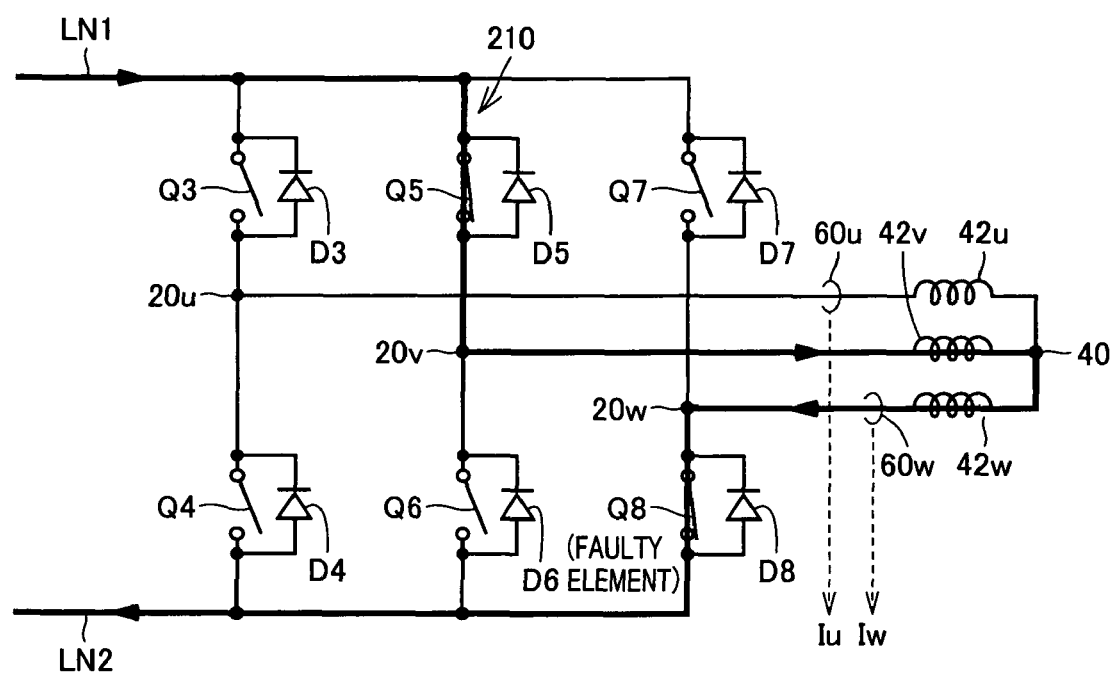
FIG. 7 is a circuit diagram for illustrating an operation of detecting a short fault in a switching element of the third embodiment according to the invention.

FIG. 7 is a circuit diagram for illustrating an operation of detecting the short fault in switching elements Q3-Q8 according to the third embodiment.

Referring to FIG. 7, when the short circuit fault occurs, e.g., in switching element Q8 that is the W-phase lower arm, switching element Q5 that is the upper arm element of the phase different from that of the faulty element is turned on. Thereby, short circuit path 210 is formed between power supply line LN1 and ground line LN2 through switching element Q5, output conductor 20v, V-phase coil 42v, neutral point 40, W-phase coil 42w, output conductor 20w and switching element Q8. In this case, a large short circuit current occurs on short circuit path 21 Q so that the inverter current increases.

Output conductor 20u is provided with a current sensor 60u for detecting a motor current Iu flowing through U-phase coil 42u. Likewise, output conductor 20w is provided with a current sensor 60w for detecting a motor current Iw flowing through W-phase coil 42w.

FIG. 7 shows only two current sensors 60u and 60w. In three-phase AC motor M1, by detecting motor currents Iu and Iw flowing through the two phases, respectively, it is possible to arithmetically obtain a motor current Iv flowing through the remaining phase based on detected motor currents Iu and Iw. Therefore, for individually detecting motor currents Iu, Iv and Iw flowing through three-phase coils 42u, 42v and 42w, respectively, the structure may employ a current sensor that detects motor current Iv flowing through V-phase coil 42v.

Control device 30 (not shown) receives motor current Iu and Iw from current sensors 60u and 60w, respectively. Control device 30 converts the torque command for three-phase AC motor M1 into current commands, and performs the feedback (i.e., so-called "current control") by PI control so that the actual current values (corresponding to the sensor values, respectively) may match with these current commands, respectively.

In this embodiment, the shorted faulty switching element is detected based on the sensed values of current sensors 60u and 60w in addition to overcurrent detection signal OIH provided fro overcurrent detecting device 50. More specifically, in a switching pattern turning on only one switching element (e.g., Q5) in inverter 14 for predetermined time period t1, when the overcurrent is detected in inverter 14 within predetermined time period t1, it is determined that the short fault has occurred in switching element Q6 that is the lower arm element of the same phase as switching element Q5.

When the overcurrent is not detected in inverter 14 within predetermined time period t1, it is determined that switching element Q6 is normal (not shorted), and further it is determined whether current sensors 60u and 60w detect motor currents Iu and Iw, respectively, or not. When current sensor 60w detects motor current Iw as shown in FIG. 7, it is determined that the short fault has occurred in switching element Q8.

Although not shown in the figure, when current sensor 60u detects motor current Iu, it is determined that switching element Q4 has the short fault.

As described above, in the switching pattern that turns on only one switching element Q5 for predetermined time period t1, it is possible to determine the short fault in switching elements Q4, Q6 and Q8 based on overcurrent detection signal OIH provided from overcurrent detecting device 50 and the sensed values of current sensors 60u and 60w. Therefore, when the determination about the short fault in switching elements Q3, Q5 and Q7 is performed by turning on only switching element Q6 for predetermined time period t1, it is possible to determine the short fault in all switching elements Q3-Q8 by performing the turn-on operations only two times in total. This manner remarkably decreases the number of times of turning on switching elements Q3-Q8 so that the damage of the switching elements can be suppressed.

Figure 8:
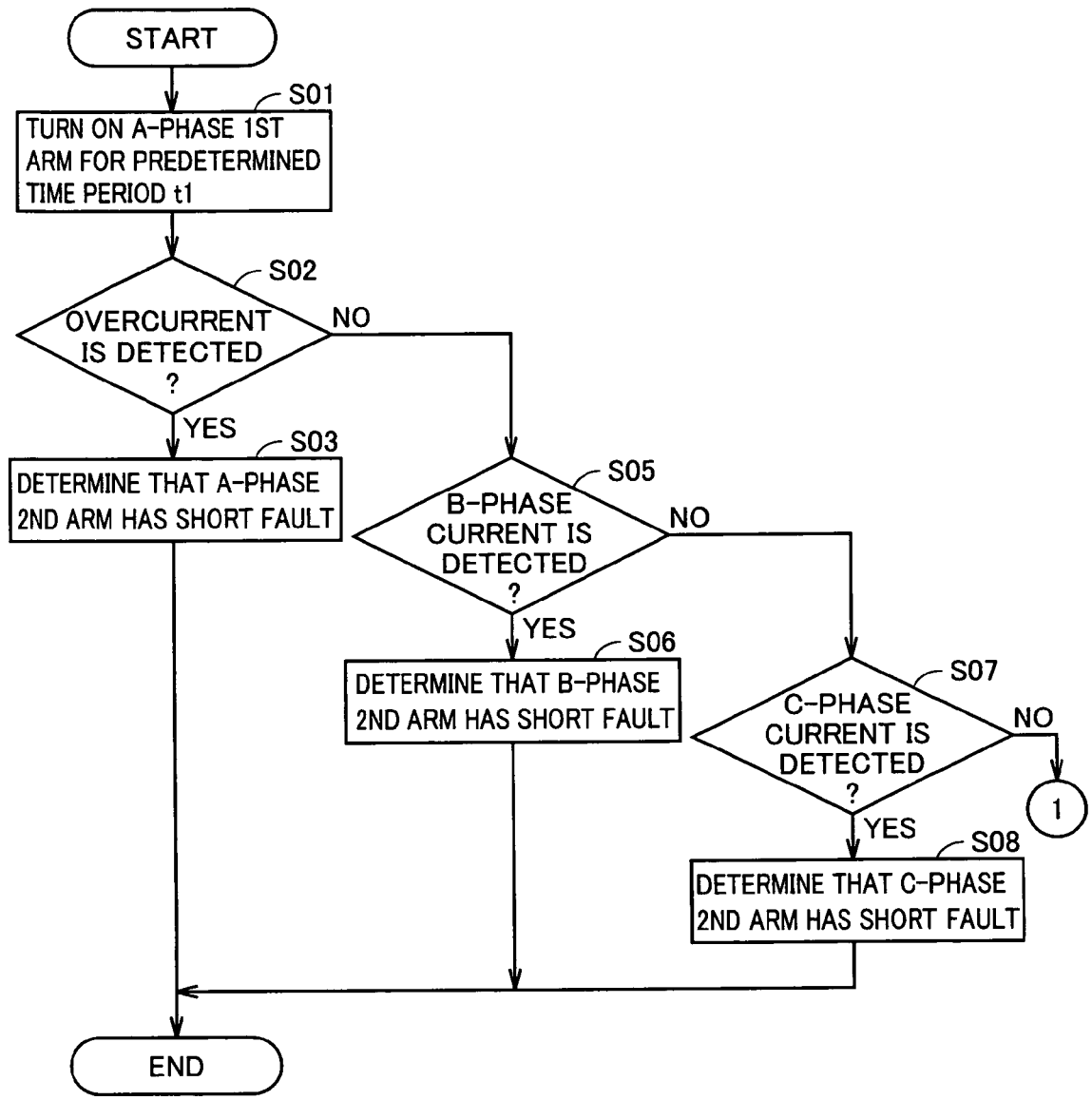
FIG. 8 is a flowchart for illustrating an operation of detecting a short fault in the switching element forming an inverter according to the third embodiment of the invention.
Figure 9:
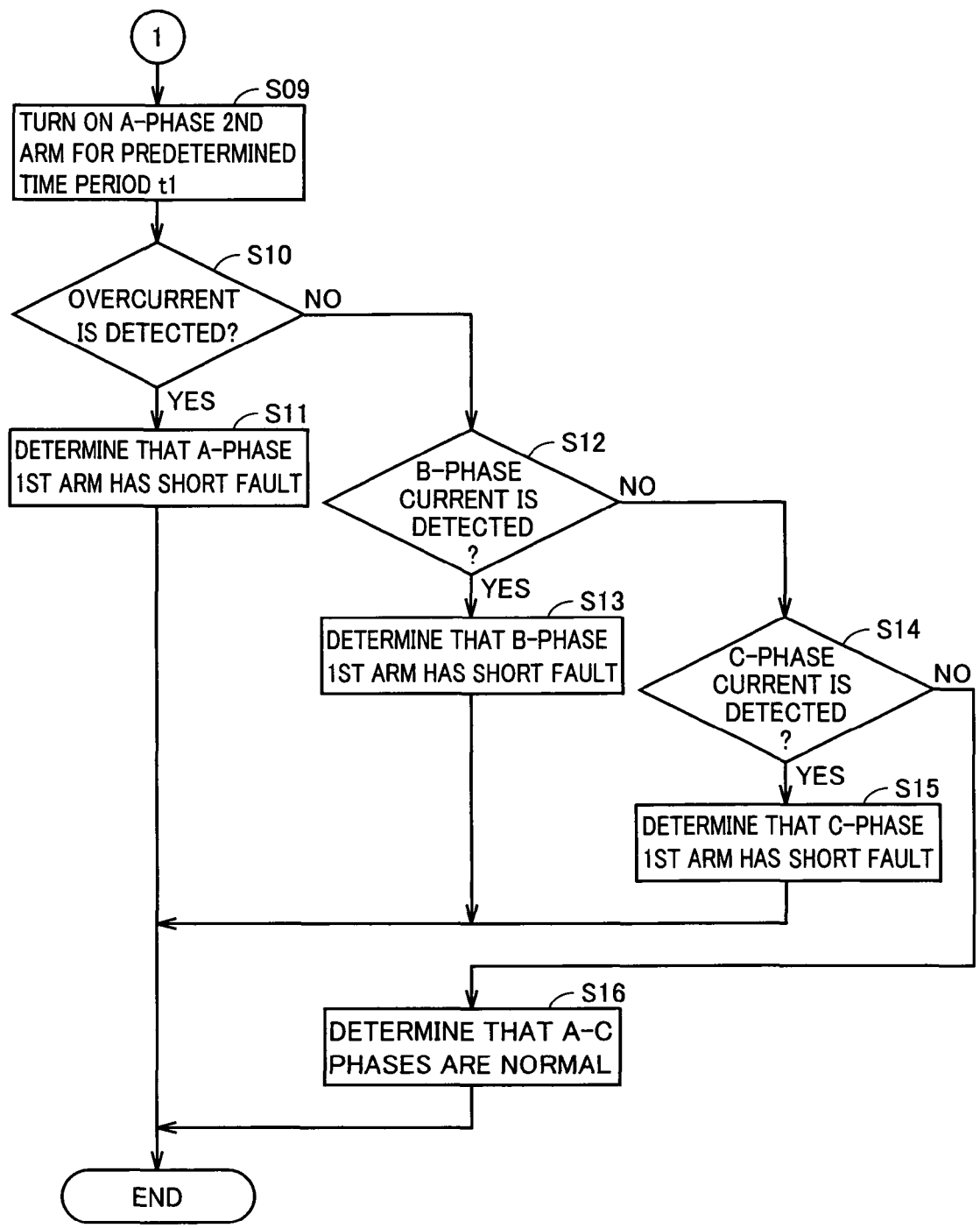
FIG. 9 is a flowchart for illustrating an operation of detecting a short fault in the switching element forming the inverter according to the third embodiment of the invention.

FIGS. 8 and 9 are flowcharts for illustrating the operation of detecting the short fault in switching elements Q3-Q8 forming inverter 14 according to the third embodiment of the invention.

Referring to FIG. 8, when a series of operations start, control device 30 turns on the switching element forming the A-phase first arm according to the preset switching pattern of inverter 14 (step S01). The A-phase is one of the U-, V- and W-phases, and the first arm is one of the upper and lower arms.

Based on overcurrent detection signal OIH provided from overcurrent detecting device 50, control device 30 determines whether inverter 14 detects the overcurrent within predetermined time period t1 or not (step S02).

When the overcurrent is detected in inverter 14 within predetermined time period t1, control device 30 determines that the switching element forming the A-phase second arm has the short fault (step S03). The second arm is vertically opposite to the first arm already described.

When the overcurrent is not detected in inverter 14 within predetermined time period t1 in step S02, control device 30 determines that the A-phase second arm is normal (i.e., does not have the short fault). Further, control device 30 determines whether the B-phase motor current is detected or not, based on sensed values Iu and Iw provided from current sensors 60u and 60w, respectively, (step S05). The B-phase is one of the U-, V- and W-phases, and is different from the foregoing A-phase.

When the B-phase motor current is detected, control device 30 determines that the switching element forming the B-phase second arm has the short fault (step S06).

When the B-phase motor current is not detected in step S05, control device 30 determines that the B-phase second arm is normal (i.e., does not have the short fault). Further, control device 30 determines whether a C-phase motor current is detected or not, based on sensed values Iu and Iw provided from current sensors 60u and 60w, respectively (step S07). The C-phase is one of the U-, V- and W-phases, and is different from the foregoing A- and B-phases.

When the C-phase motor current is detected, control device 30 determines that the switching element forming the C-phase second arm has the short fault (step S08). When the C-phase motor current is not detected in step S07, control device 30 determines that the C-phase second arm is normal (i.e., does not have the short fault), and the process proceeds to step S09 (FIG. 9).

In step S09, control device 30 turns on the switching element forming the A-phase second arm for predetermined time period t1. In and after step S09, control device 30 executes the operations similar to the series of operations in steps S01-S08, and thereby determines any short fault in the A-, B- and C-phase first arms.

More specifically, control device 30 determines whether the overcurrent is detected in inverter 14 within predetermined time period t1 or not, based on overcurrent detection signal OIH provided from overcurrent detecting device 50 (step S10).

When the overcurrent is detected in inverter 14 within predetermined time period t1, control device 30 determines that the switching element forming the A-phase first arm has the short fault (step S11).

When the overcurrent is not detected in inverter 14 within predetermined time period t1 in step S10, control device 30 determines that the A-phase first arm is normal (i.e., does not have the short fault). Further, control device 30 determines whether the B-phase motor current is detected or not, based on sensed values Iu and Iw provided from current sensors 60u and 60w, respectively (step S12). When the B-phase motor current is detected, control device 30 determines that the switching element forming the B-phase first arm has the short fault (step S13).

When the B-phase motor current is not detected in step S12, control device 30 determines that the B-phase first arm is normal (i.e., does not have the short fault). Further, control device 30 determines whether the C-phase motor current is detected or not, based on sensed values Iu and Iw provided from current sensors 60u and 60w, respectively (step S14).

When the C-phase motor current is detected, control device 30 determines that the switching element forming the C-phase first arm has the short fault (step S15). When the C-phase motor current is not detected in step S14, control device 30 determines that all the arms of the A-, B- and C-phases are normal (i.e., do not have the short fault) in step S16, and ends the series of operations.

Fourth Embodiment

A fourth embodiment will be described in connection with a detection method in which accurate determination of a faulty element can be performed by turning on switching elements fewer times without using the sensed values of current sensors 60u and 60w (FIG. 7).

Figure 10:
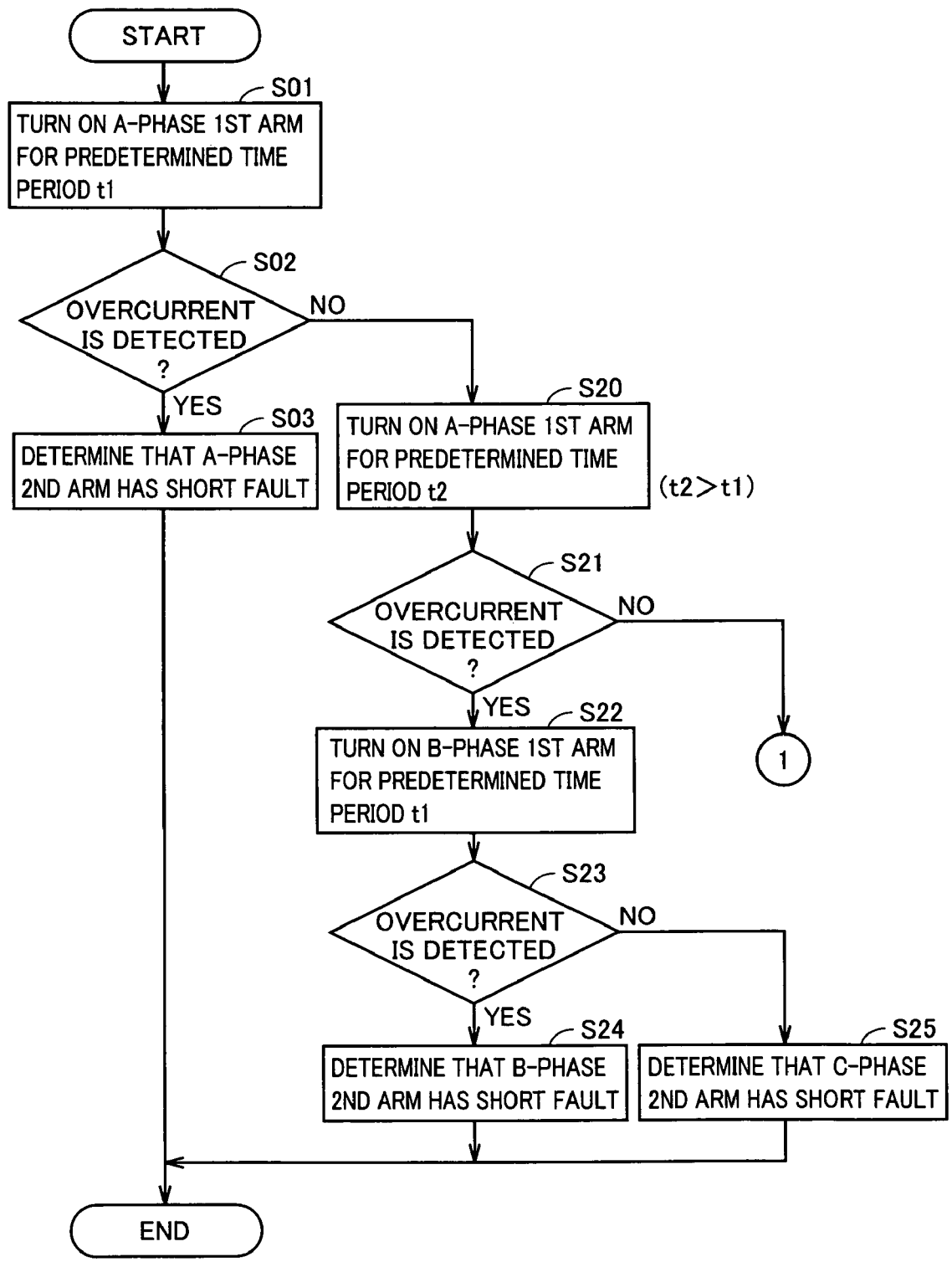
FIG. 10 is a flowchart for illustrating an operation of detecting a short fault in a switching element forming an inverter according to the fourth embodiment according to the invention.

FIGS. 10 and 11 are flowcharts for illustrating the operation of detecting the short fault in switching elements Q3-Q8 forming inverter 14 according to the fourth embodiment of the invention.

Referring to FIG. 10, when a series of operations start, control device 30 turns on the switching element forming the A-phase first arm for predetermined time period t1 according to the preset switching pattern of inverter 14 (step S01). The A-phase is one of the U-, V- and W-phases, and the first arm is one of the upper and the lower arms.

Based on overcurrent detection signal OIH provided from overcurrent detecting device 50, control device 30 determines whether the overcurrent is detected in inverter 14 within predetermined time period t1 or not (step S02).

When the overcurrent is detected in inverter 14 within predetermined time period t1, control device 30 determines that the switching element forming the A-phase second arm has the short fault (step S03). The second arm is vertically opposite to the foregoing first arm.

In step S02, when the overcurrent is not detected in inverter 14 within predetermined time period t1, control device 30 determines that the A-phase second arm is normal (i.e., does not have the short fault), and turns on the switching element forming the A-phase first arm for a predetermined time period t2 longer than predetermined time period t1 (step S20).

This predetermined time period t2 is preset, and is much longer than time period T (see equation (4)) that elapses until the inverter current of short circuit path 210 in foregoing FIG. 3 reaches predetermined threshold Ith causing the overcurrent.

Control device 30 determines whether the overcurrent is detected in inverter 14 within predetermined time period t2 or not, based on overcurrent detection signal OIH provided from overcurrent detecting device 50 (step S21).

When the overcurrent is detected in inverter 14 within predetermined time period t2, control device 30 determines that the switching element forming the B- or C-phase second arm has the short fault. Thereby, control device 30 turns on the switching element forming the B-phase first arm for predetermined time period t1 (step S22), and determines whether the overcurrent is detected in inverter 14 within predetermined time period t1 or not, based on overcurrent detection signal OIH provided from overcurrent detecting device 50 (step S23).

When the overcurrent is detected in inverter 14 within predetermined time period t1, control device 30 determines that the switching element forming the B-phase second arm has the short fault (step S24). When the overcurrent is not detected in inverter 14 within predetermined time period t1, control device 30 determines that the switching element forming the C-phase second arm has the short fault (step S25).

Returning to step S21, when the overcurrent is not detected in inverter 14 within predetermined time period t2, control device 30 determines that both the switching elements forming the B- and C-phase second arms, respectively, are normal (i.e., do not have the short fault), and advances the processing to step S26.

In step S26, control device 30 turns on the switching element forming the A-phase second arm for predetermined time period t1. In and after this step S26, control device 30 performs the operations similar to the series of operations in steps S01-S25, and thereby determines the short fault in the A-, B- and C-phase first arms.

More specifically, control device 30 determines whether the overcurrent is detected in inverter 14 within predetermined time period t1 or not, based on overcurrent detection signal OIH provided from overcurrent detecting device 50 (step S27).

The overcurrent is detected in inverter 14 within predetermined time period t1, control device 30 determines that the switching element forming the A-phase first arm has the short fault (step S28).

When the overcurrent is not detected within predetermined time period t1 in step S27, control device 30 determines that the A-phase first arm is normal (i.e., do not have the short fault), and turns on the switching element forming the A-phase second arm for predetermined time period t2 (step S29). Control device 30 determines whether the overcurrent is detected in inverter 14 within predetermined time period t2 or not, based on overcurrent detection signal OIH provided from overcurrent detecting device 50 (step S30).

When the overcurrent is detected in inverter 14 within predetermined time period t2, control device 30 determines that the switching element forming the B- or C-phase first arm has the short fault. Therefore, control device 30 turns on the switching element forming the B-phase second arm for predetermined time period t1 (step S31), and determines whether the overcurrent is detected in inverter 14 within predetermined time period t1 or not, based on overcurrent detection signal OIH provided from overcurrent detecting device 50 (step S32).

When the overcurrent is detected in inverter 14 within predetermined time period t1, control device 30 determines that the switching element forming the B-phase first arm has the short fault (step S33). When the overcurrent is not detected in inverter 14 within predetermined time period t1, control device 30 determines that the switching element forming the C-phase first arm has the short fault (step S34).

Returning to step S30, when the overcurrent is not detected in inverter 14 within predetermined time period t2, control device 30 determines that both the switching elements forming the B- and C-phase first arms, respectively, are normal (i.e., do not have the short fault) in step S35, and ends the series of operations.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An abnormality detecting device for detecting an abnormality in an electric power converting device supplying a drive current to an AC motor,
said electric power converting device including:
first and second power supply lines supplying a DC power from a power supply, and
first to n-th (n is a natural number) switching circuits connected in parallel between said first and second power supply lines, and connected to coils of first to n-th phases of said AC motor, respectively;
each of said first to n-th switching circuits having first and second switching elements connected in series together at a connection point which is connected to a coil of a corresponding phase of said AC motor;
said abnormality detecting device comprising:
a first switching control unit turning on the first switching element of the i-th (i is a natural number not exceeding n) switching circuit for a first predetermined time period, and
a short fault determining unit determining that the second switching element of said i-th switching circuit has a short fault, when an overcurrent exceeding a predetermined threshold is detected within said first predetermined time period; wherein
said first predetermined time period is shorter than a time period, in the case where the short fault is present in any one of the second switching elements of the remaining switching circuits other than said i-th switching circuit, from a time point of turning on the first switching element of said i-th switching circuit to a time point of attaining said predetermined threshold by a current flowing through a short circuit path extending from said first power supply line through said AC motor and the second switching element of said remaining switching circuit to said second power supply line.

2. The abnormality detecting device according to claim 1, further comprising:
a second switching control unit turning on the first switching element of said i-th switching circuit for a second predetermined time period longer than said first predetermined time period, wherein
said short fault determining unit determines that the second switching element of said remaining switching circuit has the short fault, when the overcurrent is not detected within said first predetermined time period and is detected within said second predetermined time period.

3. The abnormality detecting device according to claim 1, further comprising:
a current sensor detecting said drive current supplied to each of said first to n-th coils, wherein
said short fault determining unit determines that the second switching element of the k-th (k is a natural number not exceeding n and is different from i) switching circuit has the short fault, when the overcurrent is not detected within said first predetermined time period and said current sensor detects said drive current supplied to the k-th coil.

4. The abnormality detecting device according to claim 1, further comprising:
- a second switching control unit turning on the first switching element of said i-th switching circuit for a second predetermined time period longer than said first predetermined time period when the overcurrent is not detected within said first predetermined time period; and
- a third switching control unit turning on the first switching element of the k-th (k is a natural number not exceeding n and is different from i) switching circuit for said first predetermined time period when the overcurrent is detected within said second predetermined time period, wherein
- said short fault determining unit determines that the second switching element of said k-th switching circuit has the short fault, when the overcurrent is detected within said first predetermined time period during an operation of said third switching control unit.

5. The abnormality detecting device according to claim 1, wherein
- said power supply includes a voltage converter configured to control variably the DC voltage supplied to said first and second power supply lines by a boosting operation, and
- said abnormality detecting device further comprises a voltage conversion control unit stopping said boosting operation during execution of abnormality detection.

6. An abnormality detecting method for detecting an abnormality in an electric power converting device supplying a drive current to an AC motor,
said electric power converting device including:
- first and second power supply lines supplying a DC power from a power supply, and
- first to n-th (n is a natural number) switching circuits connected in parallel between said first and second power supply lines, and connected to coils of first to n-th phases of said AC motor, respectively;
- each of said first to n-th switching circuits having first and second switching elements connected in series together at a connection point which is connected to a coil of a corresponding phase of said AC motor;
said abnormality detecting method comprising the steps of:
- performing switching control to turn on the first switching element of the i-th (i is a natural number not exceeding n) switching circuit for a first predetermined time period, and
- determining that the second switching element of said i-th switching circuit has a short fault, when an overcurrent exceeding a predetermined threshold is detected within said first predetermined time period; wherein
- said first predetermined time period is shorter than a time period, in the case where the short fault is present in any one of the second switching elements of the remaining switching circuits other than said i-th switching circuit, from a time point of turning on the first switching element of said i-th switching circuit to a time point of attaining said predetermined threshold by a current flowing through a short circuit path extending from said first power supply line through said AC motor and the second switching element of said remaining switching circuit to said second power supply line.

7. The abnormality detecting method according to claim 6, further comprising the steps of:
- performing switching control to turn on the first switching element of said i-th switching circuit for a second predetermined time period longer than said first predetermined time period, wherein
- said step of determining that the second switching element of said i-th switching circuit has the short fault includes the step of determining that the second switching element of said remaining switching circuit has the short fault, when the overcurrent is not detected within said first predetermined time period and is detected within said second predetermined time period.

8. The abnormality detecting method according to claim 6, wherein
- said electric power converting device further includes a current sensor detecting said drive current supplied to each of said first to n-th coils, wherein
- said step of determining that the second switching element of said i-th switching circuit has the short fault includes the step of determining that the second switching element of the k-th (k is a natural number not exceeding n and is different from i) switching circuit has the short fault, when the overcurrent is not detected within said first predetermined time period and said current sensor detects said drive current supplied to the k-th coil.

9. The abnormality detecting method according to claim 6, further comprising the steps of:
- performing switching control to turn on the first switching element of said i-th switching circuit for a second predetermined time period longer than said first predetermined time period when the overcurrent is not detected within said first predetermined time period; and
- performing switching control to turn on the first switching element of the k-th (k is a natural number not exceeding n and is different from i) switching circuit for said first predetermined time period when the overcurrent is detected within said second predetermined time period, wherein
- said step of determining that the second switching element of said i-th switching circuit has the short fault includes the step of determining that the second switching element of said k-th switching circuit has the short fault, when the overcurrent is detected within said first predetermined time period during execution of said step of performing switching control to turn on the first switching element of said i-th switching circuit.

10. The abnormality detecting method according to claims 6, wherein
- said power supply includes a voltage converter configured to control variably the DC voltage supplied to said first and second power supply lines by a boosting operation, and
- said abnormality detecting method further comprises the step of stopping said boosting operation during execution of abnormality detection.

* * * * *